US008592228B2

(12) United States Patent
Donkers et al.

(10) Patent No.: US 8,592,228 B2
(45) Date of Patent: Nov. 26, 2013

(54) SEALING STRUCTURE AND METHOD OF MANUFACTURING THE SAME

(75) Inventors: Johannes Donkers, Valkenswaard (NL); Erwin Hijzen, Blanden (BE); Philippe Meunier-Beillard, Kortenberg (BE); Gerhard Koops, Aalst (BE)

(73) Assignee: NXP, B.V., Eindhoven (NL)

( * ) Notice: Subject to any disclaimer, the term of this patent is extended or adjusted under 35 U.S.C. 154(b) by 533 days.

(21) Appl. No.: 12/515,590

(22) PCT Filed: Nov. 15, 2007

(86) PCT No.: PCT/IB2007/054662
§ 371 (c)(1),
(2), (4) Date: May 20, 2009

(87) PCT Pub. No.: WO2008/062350
PCT Pub. Date: May 29, 2008

(65) Prior Publication Data
US 2010/0052081 A1 Mar. 4, 2010

(30) Foreign Application Priority Data
Nov. 20, 2006 (EP) .................................. 06077143

(51) Int. Cl.
*H01L 21/00* (2006.01)
(52) U.S. Cl.
USPC ................................................ 438/5; 438/14
(58) Field of Classification Search
USPC ....................................................... 438/5–14
See application file for complete search history.

(56) References Cited

U.S. PATENT DOCUMENTS

| 5,188,983 | A | * | 2/1993 | Guckel et al. | ................... | 438/53 |
| 2003/0089394 | A1 | | 5/2003 | Chang-Chien et al. | | |
| 2004/0219706 | A1 | | 11/2004 | Wan | | |
| 2004/0257632 | A1 | * | 12/2004 | Otsuka et al. | ................. | 359/254 |
| 2005/0006738 | A1 | | 1/2005 | Schaper | | |
| 2005/0156260 | A1 | | 7/2005 | Partridge et al. | | |
| 2005/0224714 | A1 | * | 10/2005 | Akin et al. | ..................... | 250/332 |
| 2006/0175303 | A1 | * | 8/2006 | Sparks et al. | ............. | 219/121.43 |
| 2008/0023813 | A1 | * | 1/2008 | Hartwell et al. | ............... | 257/686 |

FOREIGN PATENT DOCUMENTS

EP 1433740 A1 6/2004

OTHER PUBLICATIONS

Petersen, Kurt, Barth, Phillip, Poydock John, Brown, Joe, Mallon Jr., Joseph, Bryzek, Janusz, "Silicon Fusion Bonding for Pressure Sensors", Solid-State Sensor and Actuator Workshop 1988, Technical Digest, IEEE, Jun. 6-9, 1988, pp. 144-147.*
Zook, J.David, et al; "Polysilicon Sealed Vacuum Cavities for Microelectromechanical Systems" Journal of Vacuum Science and Technology; Vacuum, Surfaces and Films; American Institute of Physics, New York, NY, USA; 17(4); Jul./Aug. 1999; ISSN: 0734-2101.
Kim, Sang-Gi, et al; "Behavior of Trench Surface by H2 Annealing for Reliable Trench Gate Oxide"; Science Direct; Journal of Crystal Growth 255 (2003), pp. 123-129.
Sudoh, Koichi, et al; "Numberial Study on Shape Transformation of Silicon Trenches by High-Temperature Hydrogen Annealing"; Japanese Journal of Applied Physics, vol. 42, No. 9A; 2004; pp. 5937-5941.

* cited by examiner

*Primary Examiner* — Jae Lee

(57) ABSTRACT

A method of manufacturing a structure (1100), the method comprising forming a cap element (401) on a substrate (101), removing material (103) of the substrate (101) below the cap element (401) to thereby form a gap (802) between the cap element (401) and the substrate (101), and rearranging material of the cap element (401) and/or of the substrate (101) to thereby merge the cap element (401) and the substrate (101) to bridge the gap (802).

18 Claims, 4 Drawing Sheets

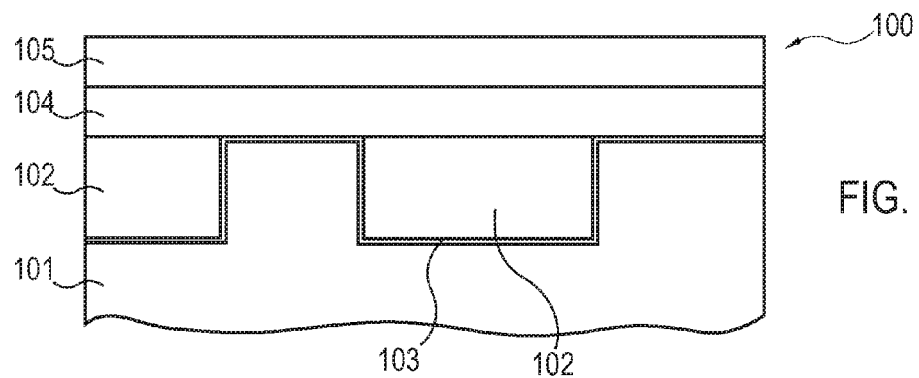
FIG. 1
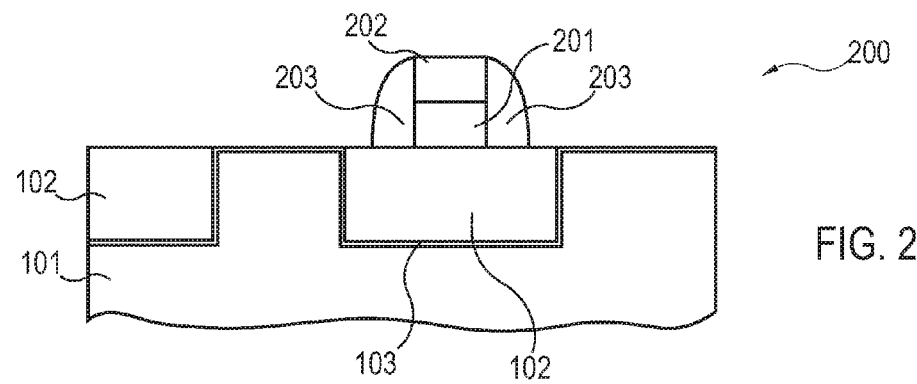
FIG. 2
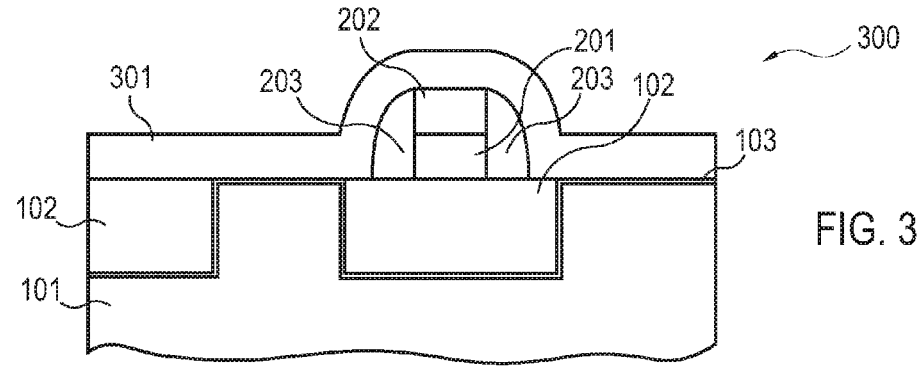
FIG. 3
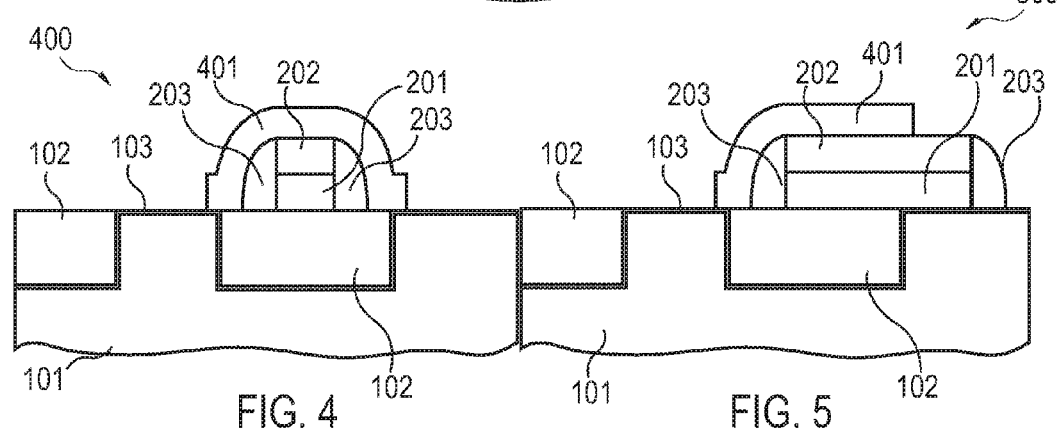
FIG. 4
FIG. 5

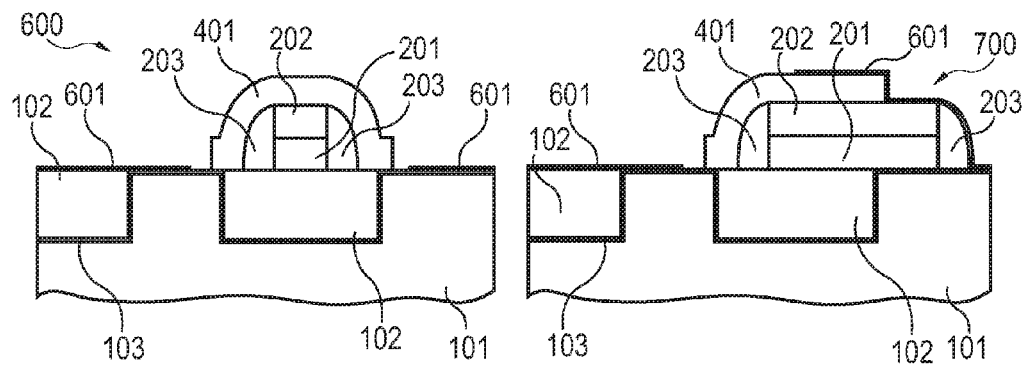
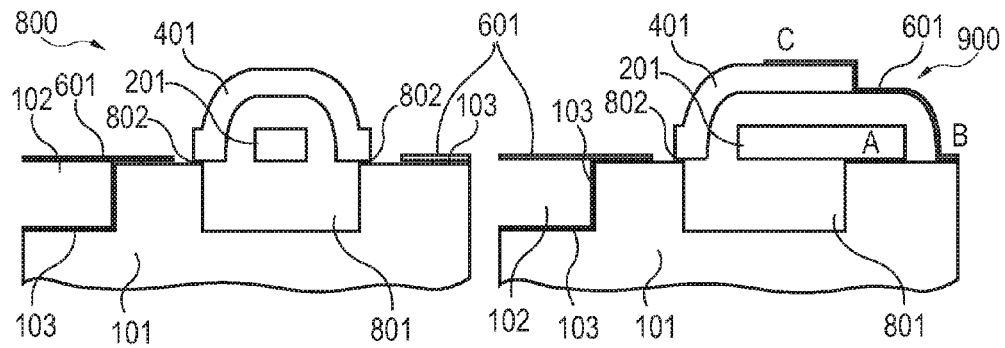
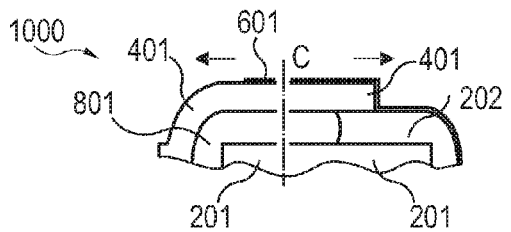
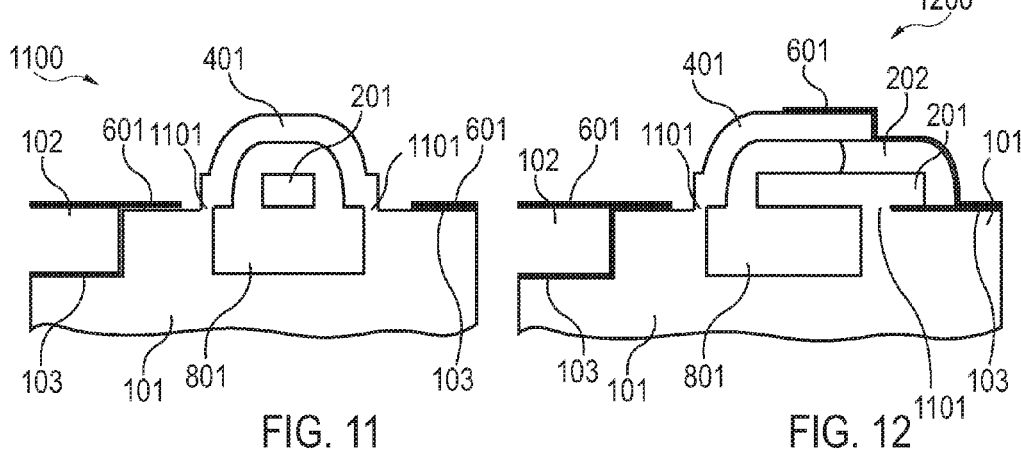

SEALING STRUCTURE AND METHOD OF MANUFACTURING THE SAME

FIELD OF THE INVENTION

The invention relates to a method of manufacturing a structure.

Moreover, the invention relates to a structure.

BACKGROUND OF THE INVENTION

The technology of MEMS (micro-electro-mechanical systems) is related to devices comprising an electronic part which may be fabricated using integrated circuit (IC) process sequences, and comprises a micromechanical component which is usually fabricated using compatible "micromachining" processes that selectively remove (for instance etch away) parts of a semiconductor (for instance silicon) wafer and/or that add new structured layers to form the mechanical and electromechanical devices.

Zook, J D, Herb, W R, Ahn, Y and Guckel, H, "Polysilicon sealed vacuum cavities for microelectromechanical systems", J. Vac. Sci. Technol. A 17(4), July/August 1999 discloses sealed vacuum cavities used in silicon-based micro-electro-mechanical systems. Sealed polysilicon cavities may serve as reference chambers for pressure sensors and provide enclosures for high-Q mechanical resonators. Optically resonant microbeams are potentially suitable for fibre optic based sensors that withstand harsh environments, including high temperature. Zook et al. 1999 thus discloses a polysilicon vacuum cavity formed by reactive sealing. Depositing a polysilicon layer on top of a sacrificial layer may form a cavity. A pattern of a thinner sacrificial structure is used as an etch channel. After the material of the sacrificial layer is removed, the reactive sealing is done with $SiH_4$. The $SiH_4$ decomposes, leaving only hydrogen that diffuses out through the silicon, leaving a hard vacuum.

However, the procedure of forming polysilicon sealed vacuum cavities of Zook et al. may be complex and may lack reliability.

OBJECT AND SUMMARY OF THE INVENTION

It is an object of the invention to provide an efficient sealing of components of a structure.

In order to achieve the object defined above, a method of manufacturing a structure and a structure according to the independent claims are provided.

According to an exemplary embodiment of the invention, a method of manufacturing a structure is provided, the method comprising forming a cap element on a substrate, removing material of the substrate below the cap element and/or removing material of the cap element above the substrate to thereby form a gap between the cap element and the substrate, and subsequently rearranging material of the cap element and/or of the substrate to thereby merge the cap element and the substrate to bridge the gap, thereby forming a bridge element from material of the substrate and/or of the cap element.

According to another exemplary embodiment of the invention, a structure is provided, the structure comprising a substrate and a cap element formed on the substrate, wherein material of the cap element and/or of the substrate is rearranged to form a bridge element to merge the cap element and the substrate thereby bridging a former gap between the cap element and the substrate. Such a structure may have a characteristic cross-sectional shape, for instance visible on an electron microscope image.

In the context of this application, the term "structure" may particularly denote any layer sequence or other integrated circuit assembly. Particularly, such a structure may be a micro-electro-mechanical system (MEMS).

The term "micro-electro-mechanical systems" (MEMS) may denote the technology of integrating mechanical elements, sensors, actuators, and electronics on a common semiconductor substrate (for instance a silicon substrate) through microfabrication technologies. While the electronics are fabricated using integrated circuit (IC) process sequences (for instance CMOS, BIPOLAR, or BICMOS processes), it may be possible according to exemplary embodiments of the invention to fabricate also the micromechanical components in semiconductor technology, for example as front end of the line MEMS devices. Micro-electro-mechanical systems may be devices and machines fabricated using techniques generally used in microelectronics, particularly to integrate mechanical or hydraulic functions, etc. with electrical functions. Micro-electro-mechanical systems may integrate mechanical structures with microelectronics. MEMS devices may be custom designed for a purpose that requires a mechanical action to be controlled by a processor. Applications include sensors, medical devices, and process controls.

The term "cap element" may particularly denote any cover or sealing element that surrounds or shields a functional component to be protected mechanically, chemically and/or electrically against an environment. Such a cap element may be a cover element having an interior cavity in which the functional component is accommodated. There may or may not be a vacuum or gaseous volume within the cap element which may allow the functional component to move (for instance oscillate) within the cap element.

The term "gap" may particularly denote a small-dimensioned opening or recess between the substrate and the cap element. Such a gap may be formed by depositing a thin layer between the substrate and the cap element (for instance a 10 nm thick silicon oxide layer) and by later removing the material of this sacrificial layer.

The term "sacrificial element" may particularly denote a structure which is formed with the intention to not remain for a long period within the structure, but which is formed with the intention to be selectively removed later, for example by a chemical treatment (for example etching). Sacrificial elements may be formed as spacers for subsequent removal with the purpose of forming gaps or air volumes. An example may be silicon oxide ($SiO_2$) that may be removed selectively by etching, for instance using HF, whereas for example a surrounding silicon nitride component ($Si_3N_4$) may remain essentially uninfluenced when the silicon oxide sacrificial element is removed.

The term "bridge" may particularly denote any member which assists in supporting a component to extend in an elevated manner with regard to another component, wherein a material-free space is remained below the bridge. In the context of this application, a bridge may have a double function as a mechanical support and as a contribution to the sealing function of the cap element.

The term "rearranging material" may particularly denote that the structure is treated in such a manner that the gap is closed not by additionally supplied material, but is closed automatically by a migration of material of the substrate and/or of the cap element to close the gap. This may be obtained, for instance, by a thermal treatment, that is to say by heating, or chemically. To trigger or promote such a migration, the material may be made mobile, for instance may be brought (close to) a liquid state.

The term "adjoining region" may particularly denote a border at which the substrate is connected to the cap element (or a border at which the substrate is connected to the functional element). At such a surface or in such a volume, material removal may result in the formation of a gap.

The term "functional component" may particularly denote any component which actually defines or dominates the actual function of the device, so that the shielding of the functional component with regard to destroying external influences may be of importance. Such a functional component, in the case of MEMS, may be a movable component like a resonator member or may be a sensor component, like a temperature sensor protected with regard to the environment by the (silicon) cap.

According to an exemplary embodiment of the invention, a structure (for instance a MEMS) may be formed, wherein a cap element (for instance made of polycrystalline silicon) may be formed on a substrate (for instance on a monocrystalline semiconductor substrate). A gap may be formed between the substrate and the cap element and may be selectively removed (for instance by chemically etching a previously deposited sacrificial layer of silicon dioxide). The gap may then be closed by forming ring-like or strut-like bridging elements which seal an interior of the cap element with regard to an environment, for instance to seal a mechanically movable component located within the cap element with regard to an exterior environment. According to an exemplary embodiment of the invention, the bridge is closed by rearranging, that is to say moving, material of the substrate, the cap element, or the substrate and the cap element so as to avoid the necessity to introduce an additional material in the manufacture procedure. Thus, this may allow forming a sealed structure without the need to provide another material, thereby improving the connection or adhering probabilities, making the structure robust against mechanical, electrical and chemical influences.

According to an exemplary embodiment of the invention, a poly silicon cap may be connected in a stable manner with a monocrystalline silicon support. Such a sealing structure may be formed in the front end of the line of an IC manufacture process, which may be preferred over the formation of such a capping member in the back end of the line. This may allow for the generation of miniaturized features/MEMS with small dimensions.

According to an exemplary embodiment of the invention, a poly silicon cap is merged to a monocrystalline silicon wafer by thermally annealing in a hydrogen atmosphere. It is presently believed that such a treatment may make the silicon material more mobile so that the viscosity of the silicon material may be modified to cause silicon material of the poly silicon cap and/or of the monocrystalline silicon wafer to close the gap. Instead of a pure hydrogen atmosphere or a chemically similar milieu may be used for annealing to promote silicon migration.

Particularly, according to an exemplary embodiment of the invention, a front end CMOS compatible RF MEMS device is provided. More particularly, a fabrication scheme is provided to manufacture a MEMS in a standard CMOS process, and particularly to seal a cavity with a hydrogen anneal at low pressure. Making MEMS devices in the front end of a CMOS process may have all the benefits of low cost standard silicon processing and may avoid a lot of problems that are in common in conventional MEMS technology, such as sealing and packaging. In such a process, the MEMS cavity may be perfectly sealed in the front end and shielded by a standard CMOS back end processing.

One exemplary aspect of the invention concerns a fabrication scheme to make MEMS in a standard CMOS process, and particularly sealing of the cavity with a hydrogen anneal at low pressure. The sealing process step has been demonstrated experimentally.

Exemplary fields of application of exemplary embodiments of the invention are MEMS resonators. Such resonators can be used to substitute crystal oscillators (XOs), for instance for timing reference purposes.

According to an exemplary embodiment of the invention, a front end CMOS compatible RF MEMS device may be provided. Particularly, a CMOS compatible method of sealing and packaging of MEMS devices such as RF MEMS may be provided by performing the steps of:

covering a resonator structure formed on shallow trench isolation pits (or another sacrificial trench structure) with a sacrificial layer and a polysilicon cap.

forming a masking layer and using it to shield other structures when selectively removing the sacrificial layer and trench material by etching through a gap between the polysilicon cap and the silicon wafer.

welding the gap between the polysilicon cap and the silicon wafer by annealing at high temperature in a hydrogen atmosphere.

Sealing and packaging of MEMS devices is an issue with respect to operativeness and reliability. In contrast to conventional methods, methods according to exemplary embodiments of the invention may be less costly and compatible to front end CMOS. During a fabrication scheme to make MEMS in a standard CMOS process, one advantage may be the welding of a structured polysilicon cap with a silicon wafer during an annealing in hydrogen atmosphere.

During such a processing scheme, a functional component (for instance a polysilicon resonating structure) may be covered by a sacrificial layer (for instance made of silicon oxide) and by a cap (for instance of polysilicon). Also, a further sacrificial layer may be provided between the cap and the wafer. After having optionally covered a portion of the surface of the structure with an etching resistant protection layer, etching of the sacrificial layer between the cap and the wafer as well as etching of the sacrificial layer within and under the cap may be performed. Therefore, a channel (for instance having a width of around 5 nm to 10 nm) may be etched. Consequently, the resonating structure housed within the cap may be capable of moving within a cavity formed by the remaining portion of the substrate and the sealing cap. The open gap between the wafer and the cap may then be closed by a welding procedure, that is to say by treating the structure during a high temperature of approximately 900° C. anneal, for example in a hydrogen atmosphere. Wishing not to be bound to a specific theory, it is presently believed that the surface of the polysilicon cap roughens and bends down during such an activation procedure. After touching the silicon wafer, both are welded finally sealing the cavity around the resonating polysilicon structure. However, it is believed that it is material of the cap element and/or of the wafer that is used for closing the gap. It is believed that the silicon material migrates possibly to reduce a surface energy. It may act in a liquid-like manner and may start wetting the other side of the channel formed by the gap. It may happen that the closure of the gap occurs directly by silicon flowing through the gap. The migration may be additionally triggered by a remaining portion of the sacrificial layer, for instance by remaining silicon dioxide material.

For example, it may be possible that remaining thermal oxide may be reduced at edges of the structure in a hydrogen atmosphere to silicon encapsulating the remaining thermal oxide. It may also be possible that the silicon material directly closes the gap, without an optional additional promotion of the migration by possibly remaining material of the thermal oxide. Thus, the silicon migration mechanism may work with or without an oxide edge.

More particularly, the removal of the oxide around the resonator may depend on the oxide thickness underneath the silicon cap, which for HF vapour is not critical. Using HF vapour at a low pressure, the etch may be proportional to the gas flow which is proportional to the opening. Making a rough estimation, when there is a 1 µm×1 µm micro cavity to etch with a 10 µm channel, the area may be about 2 to 3×0.1 $m^2$=0.02 µm$^2$ to 0.03 µm$^2$. As a comparison, for a cavity that is etched through a contact hole, 0.2 µm×0.2 µm=0.04 µm$^2$ may be a reasonable value, so the etch time may be roughly a factor two (or more) higher in this case. However, it is also possible that resonators having bigger dimensions than 1 µm×1 µm are used. Depending on a desired resonance frequency, the extension might be around 10 µm×100 µm. The dimensions of the resonator device are depending on the frequency that is targeted. It is possible that these front-end resonators may be used for high frequencies (GHz instead of MHz).

Regarding the gap closure procedure, it is believed that this may be a bending of the poly. However, it is also possible that the poly is rounded at the end, which may give a location for the silicon migration to start to merge with the silicon underneath.

Next, further exemplary embodiments of the method of manufacturing a structure will be explained. However, these embodiments also apply to the structure.

The material may be rearranged by thermally annealing the structure. For example, heating the structure in a state having still a gap between the cap element and the substrate may allow to close the gap by a silicon migration procedure. The thermal annealing of the structure may comprise treating the structure in a hydrogen atmosphere, that is to say in the presence of hydrogen. For example, the structure may be treated in the presence of HF acids. Thermally annealing the structure may comprise heating the structure to at least 650° C., particularly heating the structure to at least 800° C., more particularly heating the structure to at least 900° C. By adjusting the temperature, the speed of the bridging procedure may be influenced. For instance, an appropriate range of temperatures may be between essentially 650° C. and essentially 1100° C., particularly between essentially 800° C. and essentially 950° C. Significantly below 650° C., the mobility of (silicon) material of the substrate and the cap element may become too small. Significantly above 1100° C., components of the (semiconductor) structure may be negatively influenced.

Thermally annealing the structure may comprise treating the structure in a low-pressure atmosphere. This may also support the quality and the speed of the bridging procedure. The term "low pressure" particularly denotes a pressure of less or equal 10 Torr. A reasonable range of usable pressures is between essentially 10 mTorr and essentially 10 Torr. However, also lower pressures or atmosphere pressures are possible.

According to a preferred embodiment of the invention, a hydrogen anneal at 950° C. at a pressure of 10 Torr may be performed for one minute, forming a high-quality silicon connection between a 200 nm polysilicon layer on 15 nm of a thermal oxide to a silicon substrate.

The substrate may comprise a body (for example a semiconductor wafer, particularly a silicon wafer) and a first sacrificial material located on the body. The cap element may be formed on the first sacrificial material, and the first sacrificial material may be subsequently removed to form the gap. The first sacrificial element may be a continuous layer, for instance a layer of thermally grown silicon dioxide provided on a surface of the (semiconductor, particularly silicon) substrate. Such a thermally grown silicon oxide layer may be easily removed by an etching procedure, and may be in direct contact to a second sacrificial element (explained below) so that a removal of the first sacrificial element (for forming the gap) and the second sacrificial element (for generating a large volume in which the functional component can freely oscillate) can be performed in one single procedure, for instance a common etching. The first sacrificial element may be formed on the substrate as a thermal oxide or using a deposition technique.

The body may be a wafer or a chip, particularly made of silicon material. However, other group IV semiconductors may be used (for instance germanium). Alternatively, the structure may also be implemented in accordance with group III-group V semiconductors (for instance may be formed in gallium arsenide technology).

The method may include forming a functional component sealed within the cap element. By accommodating the functional component sealed within the substrate and the cap element, a free motion of the functional component within the hollow space defined there may be made possible.

The method may comprise forming a second sacrificial element between the functional component and the cap element, and subsequently removing the second sacrificial element to thereby allow a motion (like an oscillation) of the functional component within the cap element. The second sacrificial material may be a silicon oxide material filled into previously formed trenches of the body. Such a trench formation procedure may include shallow trench isolation (STI). The second sacrificial material may be silicon oxide, for instance.

The method may include removing material in an adjoining region between the substrate and the functional component to thereby form a further gap between the substrate and the functional component, and rearranging material of the substrate and/or of the functional component to thereby merge the substrate and the functional component to bridge the further gap. The method may additionally comprise removing material in the adjoining region between the substrate and the functional component simultaneously with removing material in the adjoining region between the substrate and the cap element. Additionally, the method may comprise rearranging material of the substrate and/or of the functional component simultaneously with rearranging material of the cap element and/or of the substrate. In other words, sealing the cap to the substrate and connecting a fixed portion of the functional component to the substrate may be performed by a common procedure, thereby making the method even more economical. For instance, this may be performed by a common thermal annealing in hydrogen atmosphere, for instance using the parameters as described above.

The method may further comprise forming a protection layer on a part of the substrate and/or on a part of the cap element before removing material of the substrate below the cap element to thereby prevent portions covered by the protection layer from being uncovered. For instance, a silicon nitride ($Si_3N_4$) layer may be deposited and patterned by a lithography procedure and an etching procedure. With a simple etching mask, it is possible to define portions that remain covered by the protection layer and portions that are exposed to a chemical that is capable of removing material by etching. For example, the protection layer may remain on portions of the first sacrificial layer and/or portions of the second sacrificial layer, wherein other portions of the second sacrificial layer may be exposed. Furthermore, the protection layer may cover only a portion of the silicon cap. After having patterned the protection layer, a selective removal of portions of the structure may be performed, since a used etching material may be incapable of removing material of the protection layer, whereas being capable of removing other components of the structure (for instance material of the first and the second sacrificial structures).

The material of the substrate below the cap element (for instance the thermal oxide layer) may be removed by etching—for instance by wet etching or vapor etching.

The cap element may be essentially formed with a U-shape. The U may be reversed so that the two end portions of the U contact the substrate, and the bent portion of the U may serve to shield the functional component with regard to an environment.

The formed structure may be a MEMS, particularly a micro-electro-mechanical resonator, a micro-electro-mechanical switch, a micro-electro-mechanical capacitor, a micro-electro-mechanical accelerometer, a micro-electro-mechanical sensor or a microfluidic device comprising one or more microfluidic channels.

A micro-electro-mechanical resonator may be used for RF applications as a mechanical band pass filter (operating around a resonance frequency). Depending on parameters like mass and dimensions of the micro-electro-mechanical resonator, a pass frequency may be around several 100 MHz, and with very small dimensions of the micro-electro-mechanical resonator even around several GHz or more.

The substrate and/or the cap element may comprise a semiconductor, particularly silicon. For example, the substrate may be a crystalline silicon wafer and the cap element may be made of polysilicon material.

The method may be carried out in CMOS technology, particularly in a front end procedure of CMOS technology. Since the described procedures are compatible with CMOS technology, it may be possible to form a MEMS purely in semiconductor technology.

For any method step, any conventional procedure as known from semiconductor technology may be implemented. Forming layers or components may include deposition techniques like CVD (chemical vapour deposition), PECVD (plasma enhanced chemical vapour deposition), ALD (atomic layer deposition), or sputtering. Removing layers or components may include etching techniques like wet etching, vapour etching, etc., as well as patterning techniques like optical lithography, UV lithography, electron beam lithography, etc.

Embodiments of the invention are not bound to specific materials, so that many different materials may be used. For conductive structures, it may be possible to use metallization structures, silicide structures or polysilicon structures. For semiconductor regions or components, crystalline silicon may be used. For insulating portions, silicon oxide or silicon nitride may be used.

The structure may be formed on a purely crystalline silicon wafer or on an SOI wafer (Silicon On Insulator).

Any process technologies like CMOS, BIPOLAR, BICMOS may be implemented.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

FIG. 1 to FIG. 15 show layer sequences obtained during carrying out a method of forming a MEMS structure according to exemplary embodiments of the invention.

DESCRIPTION OF EMBODIMENTS

Figure 13:
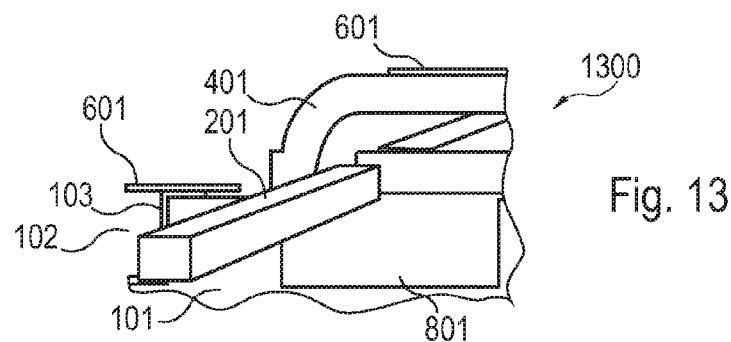

The illustration in the drawing is schematical. In different drawings, similar or identical elements are provided with the same reference signs.

In the following, referring to FIG. 1 to FIG. 15, a method of forming a MEMS resonator structure 1100 according to an exemplary embodiment of the invention will be explained. More particularly, a detailed process flow for a MEMS resonator is shown.

As shown in FIG. 1, starting point is an STI (Shallow Trench Insulation) patterned wafer 101 with the pre-gate oxide on active.

More particularly, FIG. 1 shows a crystalline silicon wafer 101 having a thermally grown silicon oxide layer 103 as a first sacrificial layer and having, deposited in trenches of the silicon substrate 101, silicon oxide portions 102 as second sacrificial structures. On top of the structure 100, a polysilicon layer 104 is formed which may later serve as a basis for a MEMS resonator. On top of the polysilicon layer 104, a TEOS layer 105 (tetraethylorthosilicate) is deposited.

The resonator to be manufactured is formed from the polysilicon material 104, but alternatively can be made on a SOI wafer (Silicon On Insulator), using the silicon layer on top of the silicon oxide as the resonator material.

As can be taken from FIG. 2, a layer sequence 200 is obtained by patterning the polysilicon layer 104, thereby forming the MEMS resonator 201. This patterning may be performed using a conventional lithography and etching procedure, for instance involving a photoresist (not shown).

Subsequently, outside spacers 203 and a top spacer 202 are formed of TEOS material.

To obtain a layer sequence 300 shown in FIG. 3, polysilicon material is deposited on the layer sequence 200 to form a polysilicon layer 301 as a basis for a cap of silicon. Optionally, the actual CMOS gate polysilicon can be used here, so that this process step can be shared according to an embodiment of the invention, thereby contributing to the cost efficient procedure.

FIG. 4 shows a view 400 of a layer sequence obtained after further processing. FIG. 5 shows a cross-sectional view perpendicular to the view 400, and is denoted with reference numeral 500.

As can be taken from FIG. 4 and FIG. 5, the polysilicon layer 301 is patterned by a lithography and etching procedure, thereby generating the polysilicon cap 401 partially on the thermal oxide layer 103, partially on the silicon oxide 102 and partially on the silicon oxide components 202, 203. Again, the second polysilicon patterning procedure shown in FIG. 4 and FIG. 5 can be the actual CMOS poly-gate procedure.

FIG. 4 and FIG. 5 show two perpendicular cross-sections to indicate that one end of the resonator 201 may be inactive and that this end can be contacted separately from the silicon cap 401 later on in the process.

FIG. 6 shows a view 600 and FIG. 7 shows a perpendicular view 700 of a layer sequence obtained after a silicon nitride deposition and patterning procedure.

More particularly, a silicon nitride layer 601 is first conformally deposited on the surface of the structures 400, 500 and is then patterned using a conventional lithography and etching procedure to selectively cover only portions of the layers 102, 103, 401, and 202, as shown in FIG. 6 and FIG. 7. This silicon nitride layer 601 can alternatively be a nitride layer formed on a thin oxide layer to make the removal easier after thermal processing. This nitride deposition and patterning may protect the structure from lift off and may also protect a patterned CMOS gate (not drawn).

More particularly, the nitride layer 601 may particularly have the following functions:

The lateral etch rate of the oxide 102, 103 underneath the nitride 601 can be tuned with the oxide thickness, and by adjusting the dimensions it is possible to prevent certain areas from complete underetching;

The nitride layer 601 may protect the CMOS devices in the wafer 101 (not shown in the figures);

The nitride layer 601 may protect the silicon cap 401 from lift off in a following wet etch procedure.

FIG. 8 and FIG. 9 show views 800 and 900 being perpendicular to one another and showing a layer sequence obtained after a further procedure.

Namely, a cavity 801 surrounded by the cap 401 and the substrate 101 is created by means of a hydrofluoric wet or vapor etch. The lateral etching of the oxide 103 underneath the nitride 601 will be limited, even for long etch times that may be needed to create the cavity 801, so that locations A and B can be protected from complete underetching by means of scaling the dimensions and the design. If length C is chosen large enough, then also the situation in FIG. 10 can be obtained, as shown in a scheme 1000.

Coming back to FIG. 8 and FIG. 9, the oxide etch removes material of the thermal oxide layer 103. Lateral etching underneath the nitride 601 may be limited, for that reason only the overlay of the poly-etch over the STI-etch is limited.

Vapour etching may be usually preferred in micromachining to avoid the problem of stiction of structures after underetching them. That is, however, not a severe problem according to exemplary embodiments of the invention, so that wet etching may be applied to avoid selectivity problems to nitride (see Witvrouw, A et al, "A comparison between wet HF etching and vapor HF etching for sacrificial oxide removal", Proc. SPIE 4174, 130, 2000). Alternatively, the nitride 601 can be capped by a thin polysilicon or amorphous silicon layer.

As shown in the scheme 1000 of FIG. 10, creation of the resonator cavity 801 is possible while keeping the oxide 202 present on one end of the resonator 201 by means of scaling the width of C. This may make it easier to connect the resonator 201 electrically.

As can be taken from a layer sequence 1100 shown in FIG. 11 (or denoted in the perpendicular cross-section of FIG. 12 with reference numeral 1200), sealing of the silicon top 401 and the resonator 201 on active using a low pressure hydrogen annealing may be performed. This is shown experimentally in FIG. 16.

Material from the cap element 401 and/or of the substrate 101 is rearranged to thereby merge the cap element 401 and the substrate 101 to bridge the gap 802, thereby forming a bridge structure 1101 of silicon material. This may ensure a proper sealing of the resonator 201 within the substrate 101 and the cap 401, thereby allowing the resonator unit 201 to move freely within the cavity 801 and to be properly protected with regard to the environment.

The electrical connections that are needed to operate the resonator structure 201 may be dependent on the frequency that is targeted. For the device that is drawn in FIG. 11 and FIG. 12, the resonance may be in the vertical direction. If, however, two extra beams would be applied, like shown in the semi-3D sketch of FIG. 13, also in-plane resonance may be achieved. Both resonance directions (arrows in the view 1400 in FIG. 14 and the view 1500 in FIG. 15) are possible.

Figures 14, 15:
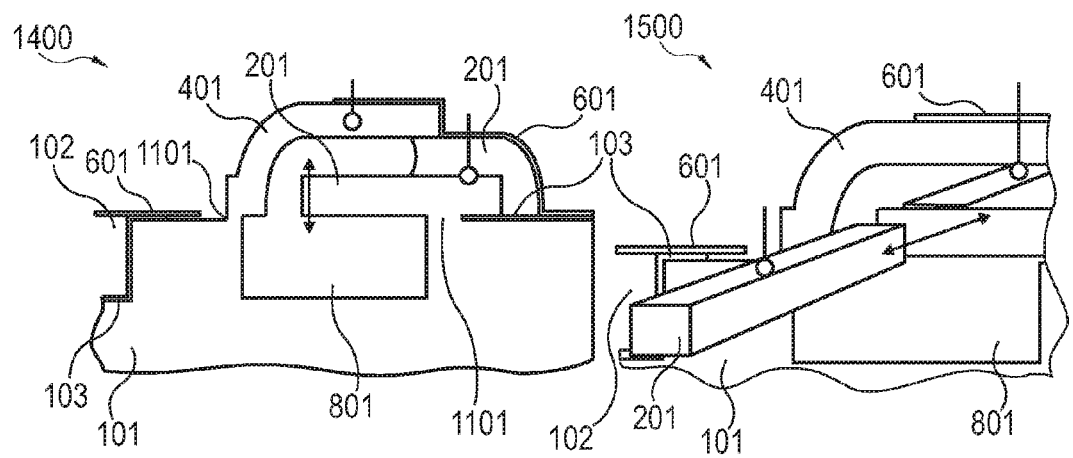

Therefore, FIG. 13 shows a semi-3D view 1300 of in-plane resonance, and FIG. 14 and FIG. 15 show vertical and in-plane resonance directions.

Figure 16:
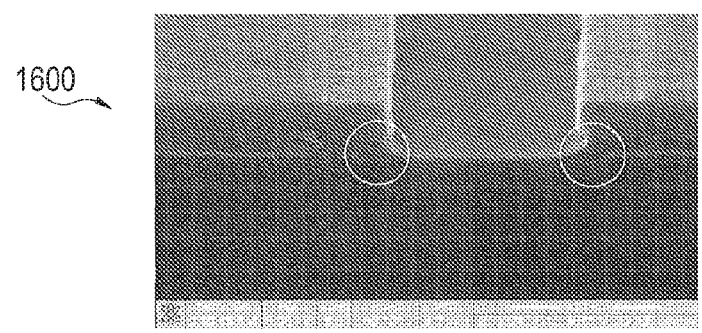
FIG. 16 shows an image of a semiconductor structure obtained by performing a hydrogen annealing procedure according to exemplary embodiments of the invention.

FIG. 16 shows a SEM image 1600 of a silicon structure according to an exemplary embodiment of the invention.

Referring to FIG. 16, a hydrogen anneal at 950° C. at 10 Torr for one minute forms a proper silicon connection between a 200 nm polysilicon layer on 15 nm of thermal oxide to a silicon substrate.

Figure 17:
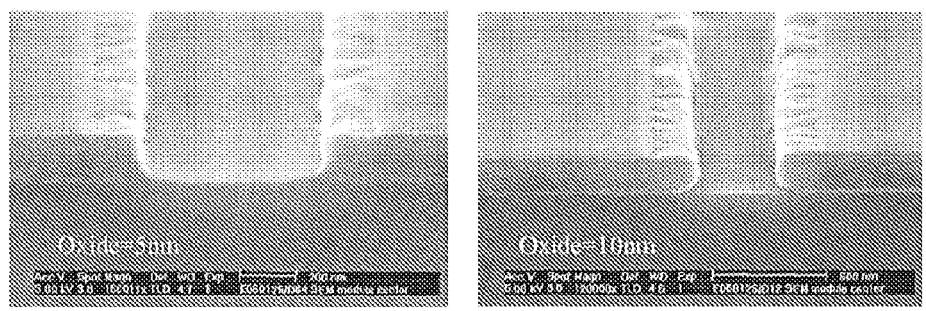
FIG. 17 to FIG. 19 show images of semiconductor structures according to exemplary embodiments of the invention.

The silicon migration procedure may behave differently on an oxide layer and on silicon. For a given oxide thickness, a minimal thermal budget may be required to close the gap (see FIG. 17). As can be taken from image 1700 shown in FIG. 17, two wafers with different thermal oxide thicknesses of 5 nm and 10 nm received a HF dip and a hydrogen anneal at 850° C. for one minute at 10 Torr.

When the "bridging" or the "closing" between the polysilicon layer 401 and the silicon substrate 101 does not occur, the polysilicon may prefer to roughen (for instance to make a rounding).

As observed experimentally, it may be possible to close 100 nm in one minute. Assuming very roughly that the gap closes at a rate of 100 nm/min, then it will take roughly 10 minutes to close 1 µm (acceptable time for production). The rate of 100 nm/min is based on the assumption that there is 1 nucleation site for the merger of the two silicon layers. For wider distances to merge it is very well possible that there are more nucleation sites, which may have an impact on the rate.

In the following, the case will be discussed where the size of the MEMS is bigger than 1 µm (for instance around 10 µm).

First, it will be discussed the case of a size significantly larger than 1 µm in a low temperature regime.

Figure 18:
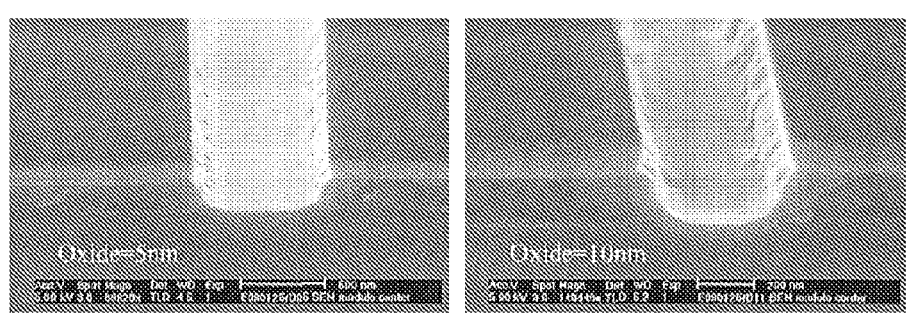

It is possible to improve the "bridging" or the "closing" between the polysilicon layer and the silicon substrate by using a two step hydrogen anneal (see image 1800 of FIG. 18). An aim of the first hydrogen anneal may be to initiate a silicon foot or a small silicon overlap of the oxide layer. This "silicon footing" may then be used to initiate the bridging between the polysilicon layer and the substrate.

As can be taken from the scheme 1800 shown in FIG. 18, the two wafers with two different oxide thicknesses of 5 nm and 10 nm received a hydrogen anneal at 700° C. for one minute (at atmospheric pressure) then an HF dip (lateral oxide etch) and a hydrogen anneal at 850° C. for one minute at 10 Torr were added.

Using a lower temperature for the second annealing step, the polysilicon 401 touches the substrate 101 for the oxide thickness of 5 nm and almost touches the substrate with an oxide of 10 nm (see scheme 1800 shown in FIG. 18). "Using a lower temperature" means lower with reference to the temperature otherwise needed to seal 10 nm with a single step process. The polysilicon layer seems to "fall" onto the substrate 101, and the poly-oxide substrate "corner" plays a less important role.

Figure 19:
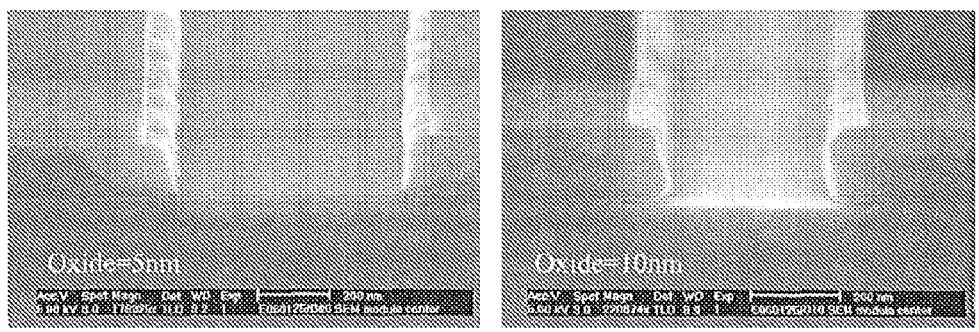

FIG. 19 shows two wafers with two different oxide thicknesses of 5 nm and 10 nm which received a hydrogen anneal at 700° C. for one minute at atmospheric pressure, and then a HF dip (lateral oxide etch) and a hydrogen anneal at 800° C. were added for one minute at 10 Torr.

The two step anneal procedure clearly enhances the merging of the layers.

Next, the case will be discussed with annealing performed at a higher temperature.

A high temperature may facilitate the "merging" of the two layers. In case the layers are not yet merged, higher temperature may enhance the roughening of the poly-layer and may then create locally some "connections" that will initiate the merging of the two layers.

High temperature may also have the benefit to enhance the silicon surface diffusion. Of course, too high temperatures may be harmful for the resonator.

In a case of a big size of the resonator, that is to say when the MEMS involves a large structure, the hydrogen anneal may help the poly-layer to fall down with its own weight of the substrate.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A method of manufacturing a structure, the method comprising
   forming a cap element on a substrate;
   removing material in an adjoining region between the substrate and the cap element to thereby form a gap between the cap element and the substrates; and
   rearranging material of the cap element or of the substrate to thereby weld the cap element to the substrate and bridge the gap.

2. The method according to claim 1, wherein the material is rearranged by thermally annealing the structure.

3. The method according to claim 2, wherein thermally annealing the structure comprises treating the structure in a hydrogen atmosphere.

4. The method according to claim 2, wherein thermally annealing the structure comprises heating the structure to at least 900° C.

5. The method according to claim 2, wherein thermally annealing the structure comprises treating the structure in a low pressure atmosphere, particularly in an atmosphere with a pressure of not more than 10 Torr.

6. The method according to claim 1, wherein the substrate comprises a body and a first sacrificial material located on the body, wherein the cap element is formed on the first sacrificial material, and wherein the first sacrificial material is subsequently removed to form the gap.

7. The method according to claim 1, further comprising forming a functional component sealed within the cap elements.

8. The method according to claim 7, further comprising forming a second sacrificial element between the functional component and the cap element, and subsequently removing the second sacrificial element to thereby allow a motion, particularly an oscillation, of the functional component within the cap element.

9. A method of manufacturing a structure comprising:
   forming a cap element on a substrate;
   removing material in an adjoining region between the substrate and the cap element to thereby form a gap between the cap element and the substrates;
   rearranging material of the cap element or of the substrate to thereby merge the cap element and the substrate to bridge the gap;
   forming a functional component sealed within the cap element;
   removing material in an adjoining region between the substrate and the functional component to thereby form a further gap between the substrate and the functional component; and
   rearranging material of the substrate or of the functional component to thereby merge the substrate and the functional component to bridge the further gap.

10. The method according to claim 9, further comprising removing material in the adjoining region between the substrate and the functional component simultaneously with removing material in the adjoining region between the substrate and the cap element.

11. The method according to claim 9, further comprising rearranging material of the substrate or of the functional component simultaneously with rearranging material of the cap element and/or of the substrate.

12. The method according to claim 1, further comprising forming a protection layer on a part of the substrate or on a part of the cap element before removing material in the adjoining region to thereby prevent portions covered by the protection layer from being removed.

13. The method according to claim 1, wherein material of the substrate below the cap element is removed by etching, particularly by at least one of a group consisting of wet etching and vapor etching.

14. The method according to claim 1, wherein the cap element is formed essentially U-shaped.

15. The method according to claim 1, wherein the substrate and the cap element comprise a semiconductor, particularly silicon.

16. The method according to claim 1, carried out in CMOS technology, particularly in a front end procedure of CMOS technology.

17. The method of claim 1, wherein:
   the material of the cap element has a first crystalline lattice structure;
   the material of the substrate has a second crystalline lattice structure; and
   the rearranging of the material joins at least one lattice point of the first crystalline lattice structure with at least one lattice point of the second crystalline lattice structure.

18. The method of claim 9, wherein the cap element is welded to the substrate.

* * * * *